US005756584A

United States Patent [19]

Bennett et al.

[11] Patent Number: 5,756,584
[45] Date of Patent: *May 26, 1998

[54] TACKIFIED PRESSURE SENSITIVE ADHESIVES

[75] Inventors: Greggory S. Bennett, Hudson, Wis.; Christopher A. Haak, Oakdale, Minn.; Craig A. Gustafson, Hudson, Wis.

[73] Assignee: Minnesota Mining and Manufacturing Company, St. Paul, Minn.

[*] Notice: The term of this patent shall not extend beyond the expiration date of Pat. Nos. 5,602,221 and 5,616,670.

[21] Appl. No.: 778,797

[22] Filed: Jan. 3, 1997

Related U.S. Application Data

[63] Continuation of Ser. No. 410,936, Mar. 27, 1995, abandoned, which is a continuation of Ser. No. 150,408, Nov. 10, 1993, abandoned.

[51] Int. Cl.⁶ .................................................. C09J 133/08
[52] U.S. Cl. .......................... 525/205; 525/204; 525/208; 525/210; 525/216; 525/218; 525/221
[58] Field of Search .................................. 525/210, 216, 525/218, 221, 204, 205, 208

[56] References Cited

U.S. PATENT DOCUMENTS

| Re. 24,906 | 12/1960 | Ulrich | 206/59 |
|---|---|---|---|
| 3,312,754 | 4/1967 | Marks et al. | 260/837 |
| 3,340,224 | 9/1967 | Sherman et al. | 260/41.5 |
| 3,406,087 | 10/1968 | Potter | 161/184 |
| 3,491,070 | 1/1970 | Weaver | 260/80.73 |
| 3,740,366 | 6/1973 | Sanderson et al. | 260/29.6 |
| 3,922,464 | 11/1975 | Silver | 428/500 |
| 4,092,443 | 5/1978 | Green | 427/53 |
| 4,181,752 | 1/1980 | Martens et al. | 427/54.1 |
| 4,199,646 | 4/1980 | Hori et al. | 428/344 |
| 4,223,067 | 9/1980 | Levens | 428/308 |
| 4,243,500 | 1/1981 | Glennon | 204/159.12 |
| 4,247,656 | 1/1981 | Janssen | 521/174 |
| 4,252,593 | 2/1981 | Green | 156/231 |
| 4,303,485 | 12/1981 | Levens | 204/159.24 |
| 4,329,384 | 5/1982 | Vesley et al. | 428/40 |
| 4,330,590 | 5/1982 | Vesley | 428/336 |
| 4,335,171 | 6/1982 | Zenk | 428/40 |
| 4,364,972 | 12/1982 | Moon | 427/54.1 |
| 4,379,201 | 4/1983 | Heilmann et al. | 428/345 |
| 4,391,687 | 7/1983 | Vesley | 204/159.16 |
| 4,404,246 | 9/1983 | Charbonneau et al. | 428/212 |
| 4,415,615 | 11/1983 | Esmay et al. | 428/40 |
| 4,418,105 | 11/1983 | Stratton | 428/40 |
| 4,418,120 | 11/1983 | Kealy et al. | 428/343 |
| 4,421,822 | 12/1983 | Levens | 428/343 |
| 4,447,579 | 5/1984 | Takagi et al. | 525/113 |
| 4,503,200 | 3/1985 | Corley | 525/532 |
| 4,513,039 | 4/1985 | Esmay | 428/40 |
| 4,522,870 | 6/1985 | Esmay | 428/252 |
| 4,548,862 | 10/1985 | Hartman | 428/323 |
| 4,552,604 | 11/1985 | Green | 156/246 |
| 4,557,960 | 12/1985 | Vernon et al. | 428/40 |
| 4,590,230 | 5/1986 | Kamada | 524/262 |
| 4,599,265 | 7/1986 | Esmay | 428/355 |
| 4,612,209 | 9/1986 | Forgo et al. | 427/54.1 |
| 4,612,242 | 9/1986 | Vesley et al. | 428/313.9 |
| 4,618,525 | 10/1986 | Chamberlain et al. | 428/209 |
| 4,619,867 | 10/1986 | Charbonneau et al. | 428/355 |
| 4,619,979 | 10/1986 | Kotnour et al. | 526/88 |
| 4,645,711 | 2/1987 | Winslow | 428/514 |
| 4,666,771 | 5/1987 | Vesley et al. | 428/325 |
| 4,673,673 | 6/1987 | Laurent et al. | 514/178 |

(List continued on next page.)

FOREIGN PATENT DOCUMENTS

| 0 252 717 A2 | 1/1988 | European Pat. Off. |
|---|---|---|
| 0 303 430 A1 | 2/1989 | European Pat. Off. |
| 0444354 A2 | 9/1991 | European Pat. Off. |
| 0511860 A1 | 11/1992 | European Pat. Off. |
| 0 546 746 A1 | 6/1993 | European Pat. Off. |
| 57-172906 | 10/1982 | Japan. |
| 10680 | 1/1988 | Japan. |
| 64-87667 | 3/1989 | Japan. |
| 1-261479 | 10/1989 | Japan. |
| 1-315409 | 12/1989 | Japan. |
| 202571 | 8/1990 | Japan. |
| 3-292379 | 12/1991 | Japan. |
| 103685 | 4/1992 | Japan. |
| 4-114079 | 4/1992 | Japan. |
| 4-255779 | 9/1992 | Japan. |
| 5-45518 | 2/1993 | Japan. |
| 5-310810 | 11/1993 | Japan. |
| 6-128544 | 5/1994 | Japan. |
| 833-995 | 7/1979 | U.S.S.R. |
| WO 91/14461 | 10/1991 | WIPO. |
| WO 92/02577 | 2/1992 | WIPO. |
| WO 92/15651 | 9/1992 | WIPO. |
| WO 93/13147 | 7/1993 | WIPO. |
| WO 93/13148 | 7/1993 | WIPO. |

OTHER PUBLICATIONS (Chem Abs: 118:60863y) Li, Shu Sheng, "Oil Absorptive Adhesives", *Zhanjie*, 1991, vol. 112, No. 6, pp. 19–22.
Fedors, Robert F., "A Method for Estimating Both the Solubility Parameters and Molar Volumes of Liquids", *Polymer Engineering and Science*, Feb., 1974, vol. 14, No. 2, pp. 147–154.

*Primary Examiner*—David Buttner
*Attorney, Agent, or Firm*—Gary L. Griswold; Walter N. Kirn; Steven E. Skolnick

[57] ABSTRACT

A pressure sensitive adhesive that includes:
  (a) the polymerization product of:
    (i) 25–98 parts by weight of an acrylic acid ester of a monohydric alcohol whose homopolymer has a $T_g$ less than 0° C.;
    (ii) 2–75 parts by weight of a non-polar ethylenically unsaturated monomer whose homopolymer has a solubility parameter of no greater than 10.50 and a $T_g$ greater than 15° C.; and
    (iii) 0–5 parts by weight of a polar ethylenically unsaturated monomer whose homopolymer has a solubility parameter of greater than 10.50 and a $T_g$ greater than 15° C.; and
  (b) at least one tackifier that is miscible in the polymerization product at room temperature.

26 Claims, No Drawings

U.S. PATENT DOCUMENTS

| | | | |
|---|---|---|---|
| 4,673,750 | 6/1987 | Beers et al. | 549/215 |
| 4,693,935 | 9/1987 | Mazurek | 428/352 |
| 4,699,842 | 10/1987 | Jorgensen et al. | 428/343 |
| 4,710,536 | 12/1987 | Klingen et al. | 524/493 |
| 4,731,273 | 3/1988 | Bonk et al. | 428/57 |
| 4,737,559 | 4/1988 | Kellen | 526/291 |
| 4,748,061 | 5/1988 | Vesley | 428/40 |
| 4,749,590 | 6/1988 | Klingen et al. | 427/54.1 |
| 4,751,269 | 6/1988 | Bonk et al. | 525/163 |
| 4,780,491 | 10/1988 | Velsey et al. | 523/219 |
| 4,818,610 | 4/1989 | Zimmerman et al. | 428/345 |
| 4,880,683 | 11/1989 | Stow | 428/200 |
| 4,895,745 | 1/1990 | Vesley et al. | 428/40 |
| 4,950,537 | 8/1990 | Vesley et al. | 428/345 |
| 4,988,742 | 1/1991 | Moon et al. | 522/79 |
| 5,013,784 | 5/1991 | Yang | 524/458 |
| 5,024,880 | 6/1991 | Ve[a]sley et al. | 428/317.5 |
| 5,028,484 | 7/1991 | Martin | 525/193 |
| 5,086,088 | 2/1992 | Kitano et al. | 522/170 |
| 5,102,924 | 4/1992 | Williams et al. | 522/4 |
| 5,106,902 | 4/1992 | Yang | 524/458 |
| 5,130,375 | 7/1992 | Bernard et al. | 525/278 |
| 5,141,989 | 8/1992 | Jung | 524/561 |
| 5,147,938 | 9/1992 | Kuller | 525/276 |
| 5,156,911 | 10/1992 | Stewart | 428/355 |
| 5,164,441 | 11/1992 | Yang | 524/458 |
| 5,262,232 | 11/1993 | Wilfong et al. | 428/327 |
| 5,278,199 | 1/1994 | Ohkawa et al. | 522/95 |
| 5,284,891 | 2/1994 | Wouters et al. | 524/522 |
| 5,308,887 | 5/1994 | Ko et al. | 522/148 |
| 5,602,221 | 2/1997 | Bennett | 526/282 |
| 5,616,670 | 4/1997 | Bennett | 526/282 |

TACKIFIED PRESSURE SENSITIVE ADHESIVES

This is a continuation of application Ser. No. 08/410,936 filed Mar. 27, 1995, now abandoned, which is a continuation of application Ser. No. 08/150,408 filed Nov. 10, 1993, now abandoned.

CROSS REFERENCE TO RELATED APPLICATIONS

This application is related to the following concurrently filed applications, all of which are assigned to the same assignee as the present application and are hereby incorporated by reference: Bennett et al., "Pressure Sensitive Thermosetting Adhesives," U.S. Ser. No. 08/150,412, filed Nov. 10, 1993 now abandoned; Bennett et al., "Pressure Sensitive Adhesives With Good Low Energy Surface Adhesion," U.S. Ser. No. 08/150,425, field Nov. 10, 1993 now abandoned; and Bennett et al., "Pressure Sensitive Adhesives With Good Oily Surface Adhesion," U.S. Ser. No. 08/150,425, filed Nov. 10, 1993 now abandoned.

BACKGROUND OF THE INVENTION

1. Field of the Invention

This invention relates to tackified pressure sensitive adhesives.

2. Description of the Background Art

Acrylate pressure sensitive adhesives are well known in the art. Many of these adhesives are copolymers of an alkyl ester of acrylic acid and a minor portion of a polar co-monomer. Due to the presence of the polar co-monomer these adhesives generally do not adhere well to low energy and oily surfaces (e.g., surfaces having a critical surface tension of wetting of no greater than about 35 dynes/cm). Although adhesion can be improved through addition of a tackifier, the degree of improvement is limited because most commercially available tackifiers are not miscible in the polar monomer-containing adhesives.

SUMMARY OF THE INVENTION

In general, the invention features a pressure sensitive adhesive that includes:

(a) the polymerization product of:
  (i) 25–98 parts by weight of an acrylic acid ester of a monohydric alcohol whose homopolymer has a $T_g$ less than 0° C.;
  (ii) 2–75 parts by weight of a non-polar ethylenically unsaturated monomer whose homopolymer has a solubility parameter of no greater than 10.50 and a $T_g$ greater than 15° C.;
  (iii) 0–5 parts by weight of a polar ethylenically unsaturated monomer whose homopolymer has a solubility parameter of greater than 10.50 and a $T_g$ greater than 15° C.; and (b) at least one tackifier that is miscible in the polymerization product at room temperature.

By "miscible" it is meant that the final pressure sensitive adhesive does not exhibit macroscopic phase separation as evidenced by optical clarity at room temperature.

In one preferred embodiment, the relative amounts of the acrylic acid ester, non-polar ethylenically unsaturated monomer, and polar ethylenically unsaturated monomer are chosen such that the 90° peel adhesion of the pressure sensitive adhesive to a polypropylene surface is at least 2 lbs/0.5 in. after a 72 hour dwell at room temperature as measured according to Test Procedure B1, infra.

In another preferred embodiment, the relative amounts of the acrylic acid ester, non-polar ethylenically unsaturated monomer, and polar ethylenically unsaturated monomer are chosen such that the 90° peel adhesion of the pressure sensitive adhesive to a surface provided with 1.5±0.25 mg/in$^2$ of oil is greater than zero after a 10 second dwell at room temperature as measured according to Test Procedure B2, infra.

The invention provides tackified pressure sensitive adhesives which, by virtue of incorporating a non-polar ethylenically unsaturated monomer and limiting the polar monomer content to no more than 5 parts, exhibit good adhesion to both low energy (e.g., plastics such as polyolefin plastics) and oily surfaces. The adhesives exhibit good adhesion to high energy surfaces such as stainless steel as well. Because the non-polar monomer reduces the polarity of the adhesive, commercially available tackifiers (many of which have low polarity themselves) are miscible in the adhesives and thus may be used. Thus, rather than tailoring the tackifier to make it miscible with the acrylate polymer, the invention tailors the properties of the acrylate polymer to make it miscible with the tackifier.

The adhesives are less toxic than, e.g., adhesives containing polar heteroatom acrylates. The adhesives further exhibit good shear properties both at low and high temperatures, particularly when a small (no more than 5 parts) of a polar co-monomer is included.

The adhesives offer the further advantage of reduced sensitivity to moisture and reduced tendency to corrode metals such as copper relative to pressure sensitive adhesives containing higher amounts of polar co-monomers. Furthermore, the adhesives interact to a lesser extent with polar additives compared to pressure sensitive adhesives containing higher amounts of polar co-monomers.

Other features and advantages will be apparent from the following description of the preferred embodiments thereof, and from the claims.

DESCRIPTION OF THE PREFERRED EMBODIMENTS

The tackified pressure sensitive adhesives of this invention display good adhesion to both low energy surfaces such as polypropylene, high energy surfaces such as stainless steel, and oily surfaces (e.g., oily metal). Examples of oily surfaces include surfaces provided with mineral oil, emulsion oils, peanut oil, motor oil (e.g., 5W-30), WD40, and Ferricote 61 A US (Quaker Chemical Co.) (a common protectant for cold rolled steel).

The 90° peel adhesion to polypropylene or to steel after a 72 hour dwell at room temperature is at least 2 lbs/0.5 in., preferably at least 3 lbs/0.5 in., and more preferably at least 4 lbs/0.5 in. measured according to Test Procedure B1, infra. The 900 peel adhesion to a surface provided with 1.5±0.25 mg/in$^2$ of oil after a 10 second dwell at room temperature is greater than zero, preferably at least 2 oz/0.5 in., and more preferably at least 4 oz./0.5 in. measured according to Test Procedure B2, infra. After a 1 minute dwell, the adhesion preferably builds to at least 5 oz/0.5 in. and more preferably to at least 10 oz/0.5 in. measured according to Test Procedure B2, infra.

The adhesives also display good cohesive strength properties as measured by the shear strength. Preferably, the shear strength at both room temperature and 70° C. is greater than 50 minutes, more preferably greater than 1,000 minutes, and even more preferably greater than 10,000 minutes measured according to Test Procedures C1 and C2, infra. These properties are achieved by controlling the monomeric composition to achieve the appropriate polarity (as measured by the solubility parameter of the homopolymers of the individual monomers determined according to the Fedors technique) and rheological properties (the $T_g$ as measured by the 1 radian/second tan delta maximum temperature of the adhesive polymer).

The ability to incorporate a tackifier increases the value of the peel strength beyond what it would be in the absence of the tackifier. The tackifier also increases "formulation freedom," i.e., the ability to adjust the properties of the adhesives for particular applications by introducing another variable, namely, the tackifier.

A list of several common monomers and their respective Fedors' solubility parameters is shown in Table 1. Table 1 is subdivided into four sections: low Tg acrylate monomers, high Tg acrylate monomers, high Tg methacrylate monomers, and vinyl monomers.

TABLE 1

FEDORS' SOLUBILITY PARAMETERS

| Repeat Unit | Solubility Parameter $(cal/cm^3)^{0.5}$ |
| --- | --- |
| Octadecyl acrylate (ODA) | 8.99 |
| Lauryl acrylate (LA) | 9.15 |
| Iso-octyl acrylate (IOA) | 9.22 |
| 2-ethylhexyl acrylate (2-EHA) | 9.22 |
| Butyl acrylate (BA) | 9.77 |
| Propyl acrylate (PA) | 9.95 |
| Ethyl acrylate (EA) | 10.20 |
| 3,3,5 trimethylcyclohexyl acrylate (TMCA) | 9.35 |
| Iso-bornyl acrylate (IBA) | 9.71 |
| Cyclohexyl acrylate (CHA) | 10.16 |
| N-octyl acrylamide (NOA) | 10.33 |
| Tetrahydrofurfuryl acrylate (THFA) | 10.53 |
| Methyl acrylate (MA) | 10.56 |
| Glycidyl acrylate (GA) | 11.32 |
| 2-Phenoxyethylacrylate (2-PhEA) | 11.79 |
| N-vinylcaprolactam (NVC) | 12.10 |
| N,N,-Dimethylacrylamide (DMA) | 12.32 |
| N-vinyl-2-pyrrolidone (NVP) | 13.38 |
| Acrylic Acid (AA) | 14.04 |
| Methylmethacrylate (MMA) | 9.93 |
| Ethylmethacrylate (EMA) | 9.72 |
| Propylmethacrylate (PMA) | 9.57 |
| Vinyl Acetate | 10.56 |
| Styrene | 11.87 |

The rheological character of the adhesive polymer can be partially but usefully described by the $T_g$ as measured by the 1 radian/second tan delta maximum temperature. It is preferable for the 1 radian/second tan delta maximum temperature of the polymer to have a value between −45° C. and 15° C., more preferably between −25° C. and 5° C., and even more preferably between −20° C. and 0° C.

The adhesives according to the invention having the requisite polarity and rheological properties contain 25–98 parts (more preferably 70–97 parts) of an acrylic acid ester whose homopolymer has a $T_g$ less than 0° C. (more preferably less than −20° C.), 2–75 parts (more preferably 3–30 parts) of a non-polar ethylenically unsaturated monomer whose homopolymer has a $T_g$ greater than 15° C., 0–5 parts (more preferably 0–3 parts) of a polar ethylenically unsaturated monomer whose homopolymer has a $T_g$ greater than 15° C., and one or more tackifiers.

The acrylic acid ester is a monofunctional acrylic ester of a monohydric alcohol having from about 4 to about 18 carbon atoms in the alcohol moiety whose homopolymer has a $T_g$ less than 0° C. Included in this class of acrylic acid esters are isooctyl acrylate, 2-ethylhexyl acrylate, isononyl acrylate, isodecyl acrylate, decyl acrylate, lauryl acrylate, hexyl acrylate, butyl acrylate, and octadecyl acrylate, or combinations thereof. In the case of octadecyl acrylate, the amount is chosen such that side chain crystallization does not occur at room temperature.

The non-polar ethylenically-unsaturated monomer is a monomer whose homopolymer has a solubility parameter as measured by the Fedors method of not greater than 10.50 and a $T_g$ greater than 15° C. The non-polar nature of this monomer improves the low energy and oily surface adhesion of the adhesive. It also improves the structural properties of the adhesive (e.g., cohesive strength) relative to a homopolymer of the acrylic acid ester described above. Examples of suitable non-polar monomers include 3,3,5 trimethylcyclohexyl acrylate, cyclohexyl acrylate, isobornyl acrylate, N-octyl acrylamide, t-butyl acrylate, methyl methacrylate, ethyl methacrylate, and propyl methacrylate or combinations thereof.

The adhesive may contain a limited quantity (e.g., no more than 5 parts) of a polar ethylenically unsaturated monomer whose homopolymer has a solubility parameter as measured by the Fedors method of greater than 10.50 and a $T_g$ greater than 15° C. to improve structural properties (e.g., cohesive strength). It is not desirable to include more than 5 parts of the polar monomer because the polar monomer impairs low energy and oily surface adhesion, and reduces tackifier miscibility. Examples of suitable polar monomers include acrylic acid, itaconic acid, certain substituted acrylamides such as N,N dimethylacrylamide, N-vinyl-2-pyrrolidone, N-vinyl caprolactam, acrylonitrile, tetrahydrofurfuryl acrylate, glycidyl acrylate, 2-phenoxyethylacrylate, and benzylacrylate, or combinations thereof.

The tackifier must be miscible with the acrylate-containing polymer of the adhesive such that macroscopic phase separation does not occur in order to improve the properties of the adhesive. Preferably, the adhesive is free of microscopic phase separation as well. Most commercially available tackifiers are hydrocarbon-based and thus of low polarity. Such tackifiers ordinarily are not miscible with conventional, polar monomer-containing adhesives. However, by incorporating a non-polar monomer into the adhesive (thereby increasing the non-polar character of the adhesive) the invention allows a variety of commercially available tackifiers to be used. The total amount of tackifer is preferably 5–60 parts per 100 parts acrylate-containing polymer, and more preferably about 15–30 parts. The particular amount of tackifier depends on the composition of the acrylate-containing polymer and is generally selected to maximum peel properties without compromising desired shear strength.

Because the adhesives are preferably prepared by polymerizing the monomers in the presence of the tackifier according to a free radical process, it is further desirable to select a tackifier that does not substantially impede the polymerization process, e.g., by acting as a free radical scavenger, chain termination agent, or chain transfer agent. A measure of the ability of the tackifier to inhibit free radical polymerization in a bulk polymerization process for a given process condition is defined here as the "inhibition factor." The inhibition factor (IF) is determined from the monomer conversion test and is the ratio of (1) the percent volatiles of the tackified sample ($C_t$) less the percent volatiles of an identically formulated and processed sample without tackifier ($C_o$) and (2) the percent volatiles of an identically formulated and processed sample without tackifier ($C_o$). The inhibition factor equation is shown below:

$$IF = \frac{(C_t - C_o)}{C_o}$$

Although a wide variety of tackifiers may be used, in cases where free radical polymerization is involved the class of tackifiers known under the tradename Regalrez resins commercially available from Hercules are preferred. These tackifiers are produced by polymerization and hydrogenation of pure monomer hydrocarbon feed stock. Suitable resins include Regalrez resins 1085, 1094, 6108, and 3102.

The monomer mixture can be polymerized by various techniques, with photoinitiated bulk polymerization being preferred. An initiator is preferably added to aid in polymerization of the monomers. The type of initiator used depends on the polymerization process. Photoinitiators which are useful for polymerizing the acrylate monomers include benzoin ethers such as benzoin methyl ether or benzoin isopropyl ether, substituted benzoin ethers such as 2-methyl-2-hydroxylpropiophenone, aromatic sulfonyl chlorides such as 2-naphthalenesulfonyl chloride, and photoactive oxides such as 1-phenyl-1,2-propanedione-2-(o-ethoxycarbonyl)oxime. An example of a commercially available photoinitiator is Irgacure™ 651 available from Ciba-Geigy Corporation, having the formula 2,2-dimethoxy- 1,2-diphenylethane-1-one). Generally, the photoinitiator is present in an amount of about 0.005 to 1 weight percent based on the weight of the monomers. Examples of suitable thermal initiators include AIBN and peroxides.

The mixture of the polymerizable monomers may also contain a crosslinking agent, or a combination of crosslinking agents, to increase the shear strength of the adhesive. Useful crosslinking agents include substituted triazines such as 2,4,-bis(trichloromethyl)-6-(4-methoxy phenyl)-s-triazine, 2,4-bis(trichloromethyl)-6-(3,4-dimethoxyphenyl)-s-triazine, and the chromophore-substituted halo-s-triazines disclosed in U.S. Pat. Nos. 4,329,384 and 4,330,590 (Vesley) incorporated herein by reference. Other useful crosslinking agents include multifunctional alkyl acrylate monomers such as trimetholpropane triacrylate, pentaerythritol tetra-acrylate, 1,2 ethylene glycol diacrylate, 1,4 butanediol diacrylate, 1,6 hexanediol diacrylate, and 1,12 dodecanol diacrylate. Various other crosslinking agents with different molecular weights between (meth)acrylate functionality would also be useful. Generally, the crosslinker is present in an amount of about 0.005 to 1 weight percent based on the weight of the monomers.

Where a foam-like pressure sensitive adhesive tape is desired, a monomer blend containing microspheres may be used. Suitable microspheres are commercially available from from Kema Nord Plastics under the trade name "Expancel" and from Matsumoto Yushi Seiyaku under the trade name "Micropearl". When expanded the microspheres have a specific density of approximately 0.02–0.036 g/cc. It is possible to include the unexpanded microspheres in the pressure sensitive adhesive composition and subsequently heat them to cause expansion when they are appropriately processed, but it is generally preferred to mix the expanded microspheres into the adhesive. This process makes it easier to ensure that the hollow microspheres in the final adhesive are substantially surrounded by at least a thin layer of adhesive.

Polymeric microspheres having a average diameter of 10 to 200 micrometers may be blended into the polymerizable composition in amounts from about 15% to about 75% by volume prior to coating. Also useful are glass microspheres having an average diameter of from 5 to 200 micrometers, preferably from about 20 to 80 micrometers. Such microspheres may comprise 5% to 65% by volume of the pressure sensitive adhesive. Both polymeric and glass microspheres are known in the art. The pressure sensitive adhesive layer of the tape should be at least 3 times as thick as the diameter of the microspheres, preferably at least 7 times.

Other tape constructions in which the pressure sensitive adhesives according to the invention are useful include mechanical fasteners such as Dual-Lock™ brand fastener (Minnesota Mining and Manufacturing Co., St. Paul, Minn.) and Scotchmate™ brand fastener (Minnesota Mining and Manufacturing Co., St. Paul, Minn.). The pressure sensitive adhesives are also useful in vibration damping applications.

Other materials which can be blended with the polymerizable monomers prior to coating include plasticizers, coloring agents, reinforcing agents, fire retardants, foaming agents, thermally conductive agents, electrically conductive agents, post-curing agents, and post-curing agent curatives and their accelerators, and the like.

The pressure sensitive adhesives according to the invention are preferably prepared by photoinitiated bulk polymerization according to the technique described in Martens et al., U.S. Pat. No. 4,181,752, hereby incorporated by reference. The polymerizable monomers and a photoinitiator are mixed together in the absence of solvent and partially polymerized to a viscosity in the range of from about 500 cps to about 50,000 cps to achieve a coatable syrup. Alternatively, the monomers may be mixed with a thixotropic agent such as fumed hydrophilic silica to achieve a coatable thickness. The crosslinking agent and any other ingredients (including the tackifier) are then added to the prepolymerized syrup. Alternatively, with the exception of the crosslinking agent, these ingredients (including the tackifier) may be added directly to monomers.

The resulting composition is coated onto a substrate (which may be transparent to ultraviolet radiation) and polymerized in an inert (i.e., oxygen free) atmosphere, e.g., a nitrogen atmosphere by exposure to ultraviolet radiation. Examples of suitable substrates include release liners (e.g., silicone release liners) and tape backings (which may be primed or unprimed paper or plastic). A sufficiently inert atmosphere can also be achieved by covering a layer of the polymerizable coating with a plastic film which is substantially transparent to ultraviolet radiation, and irradiating through that film in air as described in the aforementioned Martens et al. patent using ultraviolet lamps. Alternatively, instead of covering the polymerizable coating, an oxidizable tin compound may be added to the polymerizable syrup to increase the tolerance of the syrup to oxygen as described in U.S. Pat. No. 4,303,485 (Levens). The ultraviolet light source preferably has 90% of the emissions between 280 and 400 nm (more preferably between 300 and 400 nm), with a maximum at 351 nm.

The tackifier may also be added after polymerization of the acrylate monomers.

Where multi-layer tape constructions are desirable, one method of construction is multi-layer coating using conventional techniques. For example, the coating may be applied concurrently (e.g., through a die coater), after which the entire multi-layer structure is cured all at once. The coatings may also be applied sequentially whereby each individual layer is partially or completely cured prior to application of the next layer.

The invention will now be further described by way of the following examples.

EXAMPLES

Test Procedures

Test procedures used in the examples to evaluate pressure sensitive adhesives include the following.

Monomer Conversion Test (Test Procedure A1)

The monomer conversion was determined gravimetrically. A sample of the adhesive was weighed after it was coated and subsequently dried at 120° C. for 3 hours and then re-weighed. The percent volatiles was taken to be indicative of the monomer conversion.

Monomer Conversion Test (Test Procedure A2)

The monomer conversion was determined gravimetrically. 3 in. by 3 in. samples were laminated to a piece of aluminum foil, weighed, and placed in a forced air oven at 250° F. for 90 min. Samples were then equilibrated at room temperature and re-weighed for weight loss. The percent volatiles was taken to be indicative of the monomer conversion.

90° Peel Adhesion Test (Test Procedure B1)

One-half inch wide strips of a 5 mil adhesive sample were carefully cut and placed onto the substrate of interest. A 5 mil anodized aluminum backing, 0.625 in. wide, was then laminated to the adhesive which is approximately 5 inches long. Test substrates of interest included low energy surfaces such as polypropylene (2×"5"×3/16" natural polypropylene panels available from Precision Punch and Plastic, Minneapolis, Minn., having a mask on both sides that is removed prior to cleaning and testing) and polycarbonate (Lexan™ available from General Electric Co.), and high energy surfaces such as stainless steel (304-2BA 28 gauge stainless steel with a surface roughness of 2.0±1.0 microinches). A free end of the backing to which the adhesive was laminated extended beyond the test substrate so that it could be clamped to a load cell to determine peel strength. The sample was rolled twice back and forth with a 2 kg hard rubber roller to ensure contact between the adhesive and the test substrate. The adhesive was then removed after a given dwell time (usually 72 hours unless otherwise noted) at 12"/minute in a 90° peel mode. The peel data are reported in lbs/0.5 in. width, and represent the average of two tests.

The stainless steel substrates were washed once with acetone and 3 times with a 50/50 isopropanol/water mixture prior to testing. The plastic substrates were washed 3 times with heptane prior to testing.

90° Peel Adhesion Test (Test Procedure B2)

One-half inch wide pieces of samples were cut out and laminated to 5 mil thick anodized aluminum which was 0.625 in. wide. The adhesive thickness was 5 mils. The release liner was then removed from the adhesive and the samples were placed onto either a stainless steel substrate (304 stainless steel with a #7 finish) or a cold rolled steel substrate (20 gauge cold plate CRS 1018 with mill finish). The stainless steel substrate was cleaned prior to application of adhesive by wiping once with acetone and 3 times with heptane. The cold rolled steel substrate was cleaned prior to application of adhesive by wiping once with acetone.

Prior to application of the adhesive, an excess of mineral oil was applied to each cold rolled steel substrate with a small piece of cheese cloth and then removed to leave a coating of oil that was 1.5±0.25 mg/in.². A free end of the backing to which the adhesive was laminated extended beyond the test substrate so that it could be clamped to a load cell to determine peel strength. The sample was rolled back and forth twice with a 4.5 lb roller to ensure contact between the adhesive and the test substrate. The adhesive was then removed after a given dwell time (10 sec., 1 minute, or 24 hours) at 12"/minute in a 90° peel mode.

The values reported are in oz/0.5 in. and represent the average peel values (based on two tests) obtained between 1 and 4 inches on a 5 inch peel sample. All tests were done at room temperature.

Shear Test (Test Procedure C1)

A 0.5 inch strip of tape was adhered to a piece of stainless steel (304 stainless steel with a #7 finish) which had been cleaned once with acetone and 3 times with 50/50 isopropanol/water such that a one-half square inch overlap was accomplished. A piece of 5 mil anodized aluminum was then laminated to the entire area of the pressure sensitive adhesive, leaving an additional area to which a load could be applied. The thickness of the adhesive was 5 mils. The sample was then rolled twice back and forth with a 15 pound roller and allowed to dwell for four hours. The 70° C. samples were further allowed to dwell for 10 minutes at 70° C. After dwelling the sample was tested at either room temperature or 70° C. At room temperature a 1 kg load was applied to the adhesive and the time before the load fell was recorded. At 70° C. a 500 g load was applied to the adhesive and the time before the load fell was recorded.

The shear data are reported in minutes and represent the average of two tests.

Shear Test (Test Procedure C2)

One-half inch wide pieces of samples were cut out and laminated to 5 mil thick anodized aluminum which was 0.625 in. wide. This construction was placed on stainless steel panels (304 stainless steel with a #7 finish) that had been cleaned by wiping once with acetone and 3 times with heptane. Placement was such that a 1.0 in.×0.5 in. adhesive sample (adhesive thickness=5 mils) was in contact with the panel. The adhesive sample was rolled back and forth twice with a 4.5 lb roller, with some excess material overhanging the sample for attachment of the weight. The samples were then allowed to dwell for 24 hours before the weight was hung on the samples. The 70° C. samples were further allowed to dwell for an additional 10 minutes in the oven before the weight was applied. For the room temperature samples, a 1000 g weight was used, whereas for the 70° C. samples a 500 g weight was used.

The shear data are reported in minutes until the weight fell and represent the average of two tests.

Phase Separation (Test Procedure D)

The presence or absence of phase separation was judged by the optical clarity of the resulting polyacrylate/tackifier blend. The visual observation of opacity was taken to be indicative of a phase separation.

EXAMPLES

Examples 1–56

Example 1: 100 parts by weight of iso-octyl acrylate (IOA), iso-bornyl acrylate (IBA), and acrylic acid (AA) with a monomer ratio of 80/19.5/0.5 (IOA/IBA/AA) was blended with 0.04 parts of benzildimethylketal (KB-1, SARTOMER Company) photoinitiator and photopolymerized with an ultraviolet light source under a constant nitrogen purge to a viscosity of about 2000 cps. 0.16 parts of additional benzildimethylketal photoinitiator, 0.15 parts of 2,4-bis (trichloromethyl)-6-(4-methoxyphenyl), and 20 parts of Regalrez 1085 tackifier resin (Hercules Co.) were added to the acrylate syrup and mixed until all of the components had completely dissolved. After mixing, the blend was knife-coated at a 5 mil thickness onto a silicone-treated polyethylene-coated paper release liner. The composite was then exposed to ultraviolet radiation having a spectral output from 300–400 with a maximum at 351 nm in a nitrogen-rich environment. The average intensity was about 2.05 mW/cm$^2$, resulting in a total energy of 650 mJ/cm$^2$.

Example 2 was prepared in the same way as Example 1 except 40 parts of Regalrez 1085 tackifier was used.

Example 3 was prepared in the same way as Example 1 except Regalrez 1094 tackifier (Hercules Co.) was used.

Example 4 was prepared in the same way as Example 1 except 40 parts of Regalrez 1094 tackifier was used.

Example 5 was prepared in the same way as Example 1 except Regalrez 1128 tackifier (Hercules Co.) was used.

Example 6 was prepared in the same way as Example 1 except 40 parts of Regalrez 1128 tackifier was used.

Example 7 was prepared in the same way as Example 1 except Regalrez 6108 tackifier (Hercules Co.) was used.

Example 8 was prepared in the same way as Example 1 except 40 parts of Regalrez 6108 tackifier was used.

Example 9 was prepared in the same way as Example 1 except Regalrez 3102 tackifier (Hercules Co.) was used.

Example 10 was prepared in the same way as Example 1 except 40 parts of Regalrez 3102 tackifier was used.

Example 11 was prepared in the same way as Example 1 except Regalrez 5095 tackifier (Hercules Co.) was used.

Example 12 was prepared in the same way as Example 1 except 40 parts of Regalrez 5095 tackifier was used.

Example 13 was prepared in the same way as Example 1 except Escorez 5340 tackifier (Exxon Co.) was used.

Example 14 was prepare in the same way as Example 1 except 40 parts of Escorez 5340 tackifier was used.

Example 15 was prepared in the same way as Example 1 except Arakawa KE-311 tackifier (Arakawa) was used.

Example 16 was prepared in the same way as Example 1 except 40 parts of Arakawa KE-311 tackifier was used.

Example 17 was prepared in the same way as Example 1 except Escorez 5300 tackifier (Exxon Co.) was used.

Example 18 was prepared in the same way as Example 1 except 40 parts of Escorez 5300 tackifier was used.

Example 19 was prepared in the same way as Example 1 except Arkon E90 tackifier (Arakawa) was used.

Example 20 was prepared in the same way as Example 1 except 40 parts of Arkon E90 tackifier was used.

Example 21 was prepared in the same way as Example 1 except Arkon P115 tackifier (Arakawa) was used.

Example 22 was prepared in the same way as Example 1 except 40 parts of Arkon P115 tackifier was used.

Example 23 was prepared in the same way as Example 1 except Regalite 90 tackifier (Hercules Co.) was used.

Example 24 was prepared in the same way as Example 1 except 40 parts of Regalite 90 tackifier was used.

Example 25 was prepared in the same way as Example 1 except Exxon ECR 165B tackifier was used.

Example 26 was prepared in the same way as Example 1 except 40 parts of Exxon ECR 165B tackifier was used.

Example 27 was prepared in the same way as Example 1 except Exxon ECR 177 tackifier was used.

Example 28 was prepared in the same way as Example 1 except 40 parts of Exxon ECR 177 tackifier was used.

Example 29 was prepared in the same way as Example 1 except Arkon M100 tackifier (Arakawa) was used.

Example 30 was prepared in the same way as Example 1 except 40 parts of Arkon M100 tackifier was used.

Example 31 was prepared in the same way as Example 1 except Arkon M90 tackifier (Arakawa) was used.

Example 32 was prepared in the same way as Example 1 except 40 parts of Arkon M90 tackifier was used.

Example 33 was prepared in the same way as example 1 except Hercotac RT110 tackifier (Hercules Co.) was used.

Example 34 was prepared in the same way as Example 1 except 40 parts of Hercotac RT110 tackifier was used.

Example 35 was prepared in the same way as example 1 except Escorez 5380 tackifier (Exxon Co.) was used.

Example 36 was prepared in the same way as Example 1 except 40 parts of Escorez 5380 tackifier was used.

Example 37 was prepared in the same way as Example 1 except Foral 85 tackifier (Hercules Co.) was used.

Example 38 was prepared in the same way as Example 1 except 40 parts of Foral 85 tackifier was used.

Example 39 was prepared in the same way as Example 1 except Kristalex 5140 tackifier (Hercules Co.) was used.

Example 40 was prepared in the same way as Example 2 except 40 parts of Kristalex 5140 tackifier was used.

Example 41 was prepared in the same way as Example 1 except Hercotac 100S tackifier (Hercules Co.) was used.

Example 42 was prepared in the same way as Example 1 except 40 parts of Hercotac 100S tackifier was used.

Example 43 was prepared in the same way as Example 1 except Regalite 355 tackifier (Hercules Co.) was used.

Example 44 was prepared in the same way as Example 1 except 40 parts of Regalite 355 tackifier was used.

Example 45 was prepared in the same way as Example 1 except Wingtack Plus tackifier (Goodyear Co.) was used.

Example 46 was prepare in the same way as Example 1 except 40 parts of Wingtack Plus tackifier was used.

Example 47 was prepared in the same way as Example 1 except Hercotac RT 400 tackifier (Hercules Co.) was used.

Example 48 was prepared in the same way as Example 1 except 40 parts of Hercotac RT 400 tackifier was used.

Example 49 was prepared in the same way as Example 1 except Piccotac HM2162 tackifier (Hercules Co.) was used.

Example 50 was prepared in the same way as Example 1 except 40 parts of Piccotac HM2162 tackifier was used.

Example 51 was prepared in the same way as Example 1 except Kristalex 3100 tackifier (Hercules Co.) was used.

Example 52 was prepared in the same way as Example 1 except 40 parts of Kristalex 3100 tackifier was used.

Example 53 was prepared in the same way as Example 1 except Kristalex 1120 tackifier (Hercules Co.) was used.

Example 54 was prepared in the same way as Example 1 except 40 parts of Kristalex 1120 tackifier was used.

Example 55 was prepared in the same way as Example 1 except Piccolyte A135 tackifier (Hercules Co.) was used.

Example 56 was prepared in the same way as Example 1 except 40 parts of Piccolyte A135 tackifier was used.

The inhibition factor and phase separation characteristics of the above examples are shown in Table 2. The polypropylene peel strength of several samples were determined according to Test Procedure B1 and are reported in Table 2 as well. If the samples possessed an inhibition factor greater than 1.0 the sample was dried in a 120° C. oven to reduce the inhibition factor below 1 prior to testing. The designation "nt" means not tested. The designation "na" means not applicable. The designation "nc" means not conclusive.

TABLE 2

| Example | Inhibition Factor | Phase separation | Polypropylene Peel strength (lb/0.5") |
| --- | --- | --- | --- |
| 1 | 0.06 | no | nt |
| 2 | 0.11 | no | nt |
| 3 | 0.14 | no | nt |
| 4 | 0.37 | yes | 3.37 |
| 5 | 0.16 | yes | 3.20 |
| 6 | 0.54 | yes | 2.71 |
| 7 | 0.19 | no | 2.48 |
| 8 | 0.40 | no | 1.52 |
| 9 | 0.20 | no | 2.78 |
| 10 | 0.39 | no | 1.07 |
| 11 | 0.34 | no | nt |
| 12 | 0.80 | no | nt |
| 13 | 0.46 | yes | nt |
| 14 | 1.06 | yes | nt |
| 15 | 0.51 | no | 2.53 |
| 16 | 1.42 | no | 3.90 |
| 17 | 0.73 | yes | nt |
| 18 | 1.30 | yes | nt |
| 19 | 0.74 | no | 4.29 |
| 20 | 1.25 | no | 1.90 |
| 21 | 0.76 | yes | 3.01 |
| 22 | 1.31 | no | 3.60 |
| 23 | 0.78 | no | nt |
| 24 | 1.33 | no | nt |
| 25 | 0.80 | yes | nt |
| 26 | 1.33 | Yes | nt |
| 27 | 0.81 | yes | nt |
| 28 | 1.22 | yes | nt |
| 29 | 0.89 | no | 2.93 |
| 30 | 1.89 | no | 3.90 |
| 31 | 0.96 | no | 2.72 |
| 32 | 1.88 | no | 4.04 |
| 33 | 1.25 | no | 1.26 |
| 34 | 3.11 | yes | 0.79 |
| 35 | 1.34 | yes | nt |
| 36 | 2.42 | yes | nt |
| 37 | 1.52 | no | nt |
| 38 | 2.83 | no | nt |
| 39 | 1.61 | nc | nt |
| 40 | 2.71 | nc | 0.69 |
| 41 | 1.66 | no | 2.29 |
| 42 | 4.58 | no | 2.10 |
| 43 | 2.25 | no | 5.14 |
| 44 | 2.99 | no | 2.94 |
| 45 | 2.34 | no | 3.06 |
| 46 | 5.74 | no | 5.33 |
| 47 | 2.68 | no | 2.90 |
| 48 | 5.95 | no | 0.72 |
| 49 | 2.94 | no | 2.82 |
| 50 | 6.50 | no | 3.98 |
| 51 | 3.03 | nc | nt |
| 52 | 4.11 | nc | 0.55 |
| 53 | >6.5 | na | nt |
| 54 | >6.5 | na | nt |
| 55 | >6.5 | na | nt |
| 56 | >6.5 | na | nt |

The data of Table 2 shows that several commercial tackifiers are soluble in the non-polar acrylate pressure sensitive adhesive matrix but that only the Regalrez tackifying resins have low inhibition factors as well.

Examples 57–115

Example 57 was prepared in the same way as Example 1 except an 85/15/0 IOA/IBA/AA monomer ratio was used.

Example 58 was prepared in the same way as Example 57 except 40 parts of Regalrez 1085 tackifier was used.

Example 59 was prepared in the same way as Example 1 except an 85/14/1 IOA/IBA/AA monomer ratio was used.

Example 60 was prepared in the same way as Example 1 except an 85/13/2 IOA/IBA/AA monomer ratio was used.

Example 61 was prepared in the same way as Example 1 except an 85/11/4 IOA/IBA/AA monomer ratio was used.

Example 62 was prepared in the same way as Example 57 except 20 parts of Regalrez 6108 tackifier was used.

Example 63 was prepared in the same way as Example 62 except 40 parts of Regalrez 6108 tackifier was used.

Example 64 was prepared in the same way as Example 62 except an IOA/IBA/AA ratio of 85/14/1 was used.

Example 65 was prepared in the same way as Example 64 except 40 parts of Regalrez 6108 tackifier was used.

Example 66 was prepared in the same way as Example 64 except an IOA/IBA/AA ratio of 85/13/2 was used.

Example 67 was prepared in the same way as Example 66 except an IOA/IBA/AA ratio of 85/12/3 was used.

Example 68 was prepared in the same way as Example 57 except 20 parts of Regalrez 3102 tackifier was used.

Example 69 was prepared in the same way as Example 68 except 40 parts of Regalrez 3102 tackifier was used.

Example 70 was prepared in the same way as Example 68 except an IOA/IBA/AA ratio of 85/14/1 was used.

Example 71 was prepared in the same way as Example 70 except 40 parts of Regalrez 3102 tackifier was used.

Example 72 was prepared in the same way as Example 70 except an IOA/IBA/AA ratio of 85/13/2 was used.

Example 73 was prepared in the same way as Example 72 except an IOA/IBA/AA ratio of 85/12/3 was used.

Example 74 was prepared in the same way as Example 57 except 20 parts of Regalrez 1094 tackifier was used.

Example 75 was prepared in the same way as Example 74 except 40 parts of Regalrez 1094 tackifier was used.

Example 76 was prepared in the same way as Example 74 except an IOA/IBA/AA ratio of 85/14/1 was used.

Example 77 was prepared in the same way as Example 74 except an IOA/IBA/AA ratio of 85/13/2 was used.

Example 78 was prepared in the same way as Example 57 except an IOA/IBA/AA ratio of 90/9/1 was used.

Example 79 was prepared in the same way as Example 78 except an IOA/IBA/AA ratio of 81/13/1 was used.

Example 80 was prepared in the same way as Example 79 except 30 parts of Regalrez 1085 was used.

Example 81 was prepared in the same way as Example 79 except an IOA/IBA/AA ratio of 76/23/1 was used.

Example 82 was prepared in the same way as Example 81 except 40 parts of Regalrez 1085 was used.

Example 83 was prepared in the same way as Example 81 except an IOA/IBA/AA ratio of 81/17/2 was used.

Example 84 was prepared in the same way as Example 81 except an IOA/IBA/AA ratio of 76/22/2 was used.

Example 85 was prepared in the same way as Example 62 except an IOA/IBA/AA ratio of 90/9/1 was used.

Example 86 was prepared in the same way as Example 85 except 30 parts of Regalrez 6108 was used.

Example 87 was prepared in the same way as Example 85 except an IOA/IBA/AA ratio of 81/18/1 was used.

Example 88 was prepared in the same way as Example 87 except 40 parts of Regalrez 5108 was used.

Example 89 was prepared in the same way as Example 85 except an IOA/IBA/AA ratio of 76/23/1 was used.

Example 90 was prepared in the same way as Example 89 except 40 parts of Regalrez 5108 was used.

Example 91 was prepared in the same way as Example 85 except an IOA/IBA/AA ratio of 90/8/2 was used.

Example 92 was prepared in the same way as Example 91 except an IOA/IBA/AA ratio of 85/13/2 was used.

Example 93 was prepared in the same way as Example 92 except an IOA/IBA/AA ratio of 81/17/2 was used.

Example 94 was prepared in the same way as Example 93 except 30 parts of Regalrez 6108 was used.

Example 95 was prepared in the same way as Example 94 except 40 parts of Regalrez 6108 was used.

Example 96 was prepared in the same way as Example 92 except an IOA/IBA/AA ratio of 76/22/2 was used.

Example 97 was prepared in the same way as Example 96 except 30 parts of Regalrez 6108 was used.

Example 98 was prepared in the same way as Example 97 except 40 parts of Regalrez 6108 was used.

Example 99 was prepared in the same way as Example 68 except an IOA/IBA/AA ratio of 90/9/1 was used.

Example 100 was prepared in the same way as Example 99 except 30 parts of Regalrez 3102 was used.

Example 101 was prepared in the same way as Example 68 except an IOA/IBA/AA ratio of 81/18/1 was used.

Example 102 was prepared in the same way as Example 101 except 30 parts of Regalrez 3102 was used.

Example 103 was prepared in the same way as Example 68 except an IOA/IBA/AA ratio of 76/23/1 was used.

Example 104 was prepared in the same way as Example 103 except 30 parts of Regalrez 3102 was used.

Example 105 was prepared in the same way as Example 68 except an IOA/IBA/AA ratio of 90/8/2 was used.

Example 106 was prepared in the same way as Example 68 except an IOA/IBA/AA ratio of 81/17/2 was used.

Example 107 was prepared in the same way as Example 106 except 40 parts of Regalrez 3102 was used.

Example 108 was prepared in the same way as Example 68 except an IOA/IBA/AA ratio of 76/22/2 was used.

Example 109 was prepared in the same was as Example 74 except 10 parts of Regalrez 1094 was used and a monomer ratio of 90/9/1 IOA/IBA/AA was used.

Example 110 was prepared in the same way as Example 74 except a monomer ratio of 81/18/1 IOA/IBA/AA was used.

Example 111 was prepared in the same way as Example 109 except a monomer ratio of 76/23/1 IOA/IBA/AA was used.

Example 112 was prepared in the same way as Example 111 except 20 parts of Regalrez 1094 was used.

Example 113 was prepared in the same way as Example 109 except 10 parts of Regalrez 3102 was used, 0.09 parts of 2,4-bis(trichloromethyl)-6-(4-methoxyphenyl)-s-triazine crosslinker was used, N-octyl acrylamide (NOA) was used instead of IBA, and the monomer ratio was 89/10.5/0.5 IOA/NOA/AA.

Example 114 was prepared in the same way as Example 113 except that 30 parts Regalrez 3102 was used.

Example 115 was prepared in the same way as Example 62 except an IOA/IBA/AA ratio of 95/4.75/0.25 was used and 25 parts Regalrez 6108 was used.

Comparative Example C1

90 parts by weight of iso-octyl acrylate (IOA) and 10 parts acrylic acid (AA) were blended with 0.04 parts of 2,2-dimethoxy-2-phenylacetophenone photoinitiator (Irgacure™ 651, available from Ciba-Geigy Corp.) and photopolymerized with an ultraviolet light source under a constant nitrogen purge to a viscosity of about 3000 cps. 0.16 parts of additional 2,2-dimethoxy-2-phenylacetophenone photoinitiator and 0.15 parts of 2,4-bis(trichloromethyl)-6-(4-methoxyphenyl)-s-triazine were added to the acrylate syrup and mixed until all of the components had completely dissolved. After mixing the blend was knife-coated at a 5 mil thickness onto a silicone-treated polyethylene-coated paper release liner. The composite was then exposed to ultraviolet radiation having a spectral output from 300–400 with a maximum at 351 nm in a nitrogen-rich environment. An intensity of about 1.0 mW/cm$^2$ was used for the first one-third of the exposure time and an intensity of about 2.2 mw/cm$^2$ was used for the second two-thirds of the exposure time, resulting in a total energy of 250 mJ/cm$^2$.

Comparative example C2 was prepared in the same way as comparative example C1 except a premix of 94 parts IOA and 6 parts AA was used.

Comparative example C3 was prepared in the same way as comparative example C1 except a premix of 100 parts IOA and 0 parts AA was used.

The data of Example 57–115 and comparative examples C1, C2, and C3 are shown in Table 3. Test procedures A1, B1, and C1 were used to generate the data. The designation "nt" means not tested.

TABLE 3

| Example | St. St. Peel (lb/0.5") | Polypropylene peel (lb/0.5") | Room Temp Shear | 70° C. Shear | Percent Conversion |
|---|---|---|---|---|---|
| 57 | 3.83 | 3.63 | 313 | 35 | >98.5% |
| 58 | 3.73 | 3.87 | 1006 | 6 | >98.5% |
| 59 | 4.15 | 4.05 | 5867 | 10K+ | >98.5% |
| 60 | 2.66 | 2.84 | 7222 | 10K+ | >98.5% |
| 61 | 2.71 | 2.75 | 10K+ | 859 | >98.5% |
| 62 | 3.15 | 3.64 | 535 | 34 | >98.5% |
| 63 | 4.03 | 6.24 | 719 | 23 | >98.5% |
| 64 | 4.22 | 3.54 | 7223 | 10K+ | >98.5% |
| 65 | 5.33 | 6.84 | 2916 | 41 | >98.5% |
| 66 | 6.92 | 3.85 | 10K+ | 10K+ | >98.5% |
| 67 | 4.04 | 3.30 | 10K+ | 10K+ | >98.5% |
| 68 | 3.21 | 2.52 | 880 | 30 | >98.5% |
| 69 | 4.24 | 2.57 | 632 | 5 | >98.5% |
| 70 | 4.11 | 2.67 | 4900 | 10K+ | >98.5% |
| 71 | 4.94 | 3.04 | 1338 | 12 | >98.5% |
| 72 | 3.62 | 2.58 | 10K+ | 10K+ | >98.5% |
| 73 | 4.27 | 3.63 | 10K+ | 10K+ | >98.5% |
| 74 | 2.58 | 3.24 | 708 | nt | >98.5% |
| 75 | 3.22 | 3.26 | 1301 | nt | >98.5% |
| 76 | 3.50 | 3.54 | 10K+ | 10K+ | >98.5% |
| 77 | 3.90 | 3.38 | 10K+ | 10K+ | >98.5% |
| 78 | 2.69 | 3.55 | 2003 | 1870 | >98.5% |
| 79 | 3.24 | 3.57 | 10K+ | 3961 | >98.5% |
| 80 | 2.57 | 2.47 | 1865 | 27 | >98.5% |
| 81 | 4.32 | 3.34 | 4639 | 1714 | >98.5% |
| 82 | 3.00 | 3.91 | 242 | 5 | >98.5% |
| 83 | 3.05 | 3.00 | 5021 | 1902 | >98.5% |
| 84 | 3.39 | 3.56 | 3040 | 888 | >98.5% |
| 85 | 3.28 | 2.82 | 10K+ | 10K+ | >98.5% |
| 86 | 3.36 | 4.89 | 10K+ | 5307 | >98.5% |
| 87 | 4.96 | 3.01 | 10K+ | 10K+ | >98.5% |
| 88 | 5.60 | 5.65 | 2094 | 22 | >98.5% |
| 89 | 3.76 | 3.43 | 10K+ | 1376 | >98.5% |
| 90 | 4.76 | 3.10 | 5605 | 18 | >98.5% |
| 91 | 3.34 | 2.87 | 10K+ | 10K+ | >98.5% |
| 92 | 6.92 | 3.85 | 10K+ | 10K+ | >98.5% |
| 93 | 4.86 | 3.35 | 10K+ | 10K+ | >98.5% |
| 94 | 4.20 | 4.61 | 10K+ | 1287 | >98.5% |
| 95 | 5.73 | 3.18 | 10K+ | 60 | >98.5% |
| 96 | 4.55 | 1.75 | 10K+ | 10K+ | >98.5% |

TABLE 3-continued

| Example | St. St. Peel (lb/0.5") | Polypropylene peel (lb/0.5") | Room Temp Shear | 70° C. Shear | Percent Conversion |
|---|---|---|---|---|---|
| 97 | 5.88 | 5.44 | 10K+ | 207 | >98.5% |
| 98 | 4.58 | 4.38 | 7187 | 26 | >98.5% |
| 99 | 3.08 | 2.29 | 10K+ | 10K+ | >98.5% |
| 100 | 4.55 | 2.43 | 4516 | 1795 | >98.5% |
| 101 | 4.64 | 3.22 | 4396 | 10K+ | >98.5% |
| 102 | 4.68 | 1.63 | 2513 | 13 | >98.5% |
| 103 | 3.81 | 3.00 | 6798 | 10K+ | >98.5% |
| 104 | 4.89 | 1.64 | 10K+ | 155 | >98.5% |
| 105 | 3.72 | 2.41 | 10K+ | 10K+ | >98.5% |
| 106 | 3.61 | 1.96 | 10K+ | 10K+ | >98.5% |
| 107 | 6.63 | 4.62 | 4906 | 49 | >98.5% |
| 108 | 4.46 | 4.11 | 10K+ | 10K+ | >98.5% |
| 109 | 2.38 | 2.85 | 223 | 10K+ | >98.5% |
| 110 | 3.06 | 3.90 | 10K+ | 10K+ | >98.5% |
| 111 | 2.68 | 3.05 | 10K+ | 10K+ | >98.5% |
| 112 | 4.58 | 4.54 | 10K+ | 10K+ | >98.5% |
| 113 | 2.65 | 2.46 | 2297 | 150 | >98.5% |
| 114 | 3.66 | 4.06 | 616 | 12 | >98.5% |
| 115 | nt | nt | 2504 | 329 | >98.5% |
| C1 | 5.33 | 0.43 | 10,000+ | 10,000+ | >98.5% |
| C2 | 3.73 | 1.29 | 10,000+ | 10,000+ | >98.5% |
| C3 | 1.35 | 1.53 | 2 | 3 | >98.5% |

Examples 116–124

Example 116: 83 parts IOA and 17 parts IBA were mixed together in a jar under a constant nitrogen purge along with 0.04 parts of Irgacure 651 photoinitiator from Ciba-Geigy Corp. (2,2-dimethoxy-2-phenylacetophenone). This mixture was exposed to a low intensity ultraviolet light under a constant nitrogen purge while stirring until a coatable viscosity syrup was obtained. The conversion of this syrup was between 4 and 10% and the viscosity was about 3,000 cps. 0.12 parts of 2,4-bis(trichloromethyl)-6-(3,4-dimethoxyphenyl)-s-triazine and an additional 0.16 parts Irgacure 651 were then added to the prepolymerized syrup, along with 20.5 parts of Regalrez 6108 tackifier (Hercules Co.). The ingredients were mixed thoroughly until homogeneous and then knife-coated at a 5 mil thickness onto a silicone-treated polyethylene-coated paper release liner. The composite was then exposed to ultraviolet radiation having a spectral output from 300–400 with a maximum at 351 nm in in a nitrogen-rich environment. The average intensity was about 2.05 mW/cm². resulting in a total energy of 650 mJ/cm².

Example 117 was prepared in the same way as example 116 except that the monomer mixture was 77 parts IOA and 23 parts IBA. Also, 13.6 parts Regalrez 6108 was used.

Example 118 was prepared in the same way as example 116 except that the monomer mixture was 71 parts IOA and 21 parts IBA. Also, 7.5 parts Regalrez 6108 was used.

Example 119 was prepared in the same way as example 116 except that the monomer mixture was 84 parts IOA, 15 parts IBA, and 1 part AA. Also, 20.5 parts Regalrez 6108 was used.

Example 120 was prepared in the same way as example 116 except that the monomer mixture was 81 parts IOA, 18 parts IBA, and 1 part AA. Also, 17.6 parts Regalrez 6108 was used.

Example 121 was prepared in the same way as example 116 except that the monomer mixture was 72 parts IOA, 27 parts IBA, and 1 part AA. Also, 7.5 parts Regalrez 6108 was used.

Example 122 was prepared in the same way as example 116 except that the monomer mixture was 83 parts IOA and 17 parts IBA. Also, 5 parts Regalrez 6108 was used.

Example 123 was prepared in the same way as example 122 except that 15 parts Regalrez 6108 was used.

Example 124 was prepared in the same way as example 122 except that 30 parts Regalrez 6108 was used.

Comparative Example C4

94 parts IOA and 6 parts AA were mixed together in a jar under a constant nitrogen purge along with 0.04 parts of Irgacure 651 photoinitiator from Ciba-Geigy Corp. (2,2-dimethoxy-2-phenylacetophenone). This mixture was partially polymerized under a nitrogen-rich atmosphere to provide a coatable syrup having a viscosity of about 3,000 cps. 0.16 parts of 2,4-bis(trichloromethyl)-6-(3,4-dimethoxyphenyl)-s-triazine and an additional 0.16 parts Irgacure 651 were then added to the prepolymerized syrup and it was then knife-coated onto a release coated paper backing at a thickness of 5 mils. The resulting coating was then exposed to ultraviolet radiation having a spectral output from 300–400 with a maximum at 351 nm in a nitrogen-rich environment. The average intensity was about 2.05 mW/cm². resulting in a total energy of 650 mJ/cm².

Comparative example C5 was prepared in the same way as comparative example C4 except that a premix of 10 parts AA and 90 parts IOA was used. In addition, 0.12 parts triazine was used. Comparative example C6 was prepared in the same way as comparative example C4 except that a premix of 14 parts AA and 86 parts IOA was used.

Peel and shear data for examples 116–124 and comparative examples C4, C5, and C6 are set forth in Table 4. The data was generated according to Test Procedures A2, B2, and C2.

TABLE 4

| PATENT EXAMPLES FOR TACKIFIED NPAs FOR OILY METAL SURFACES | | | | | | |
|---|---|---|---|---|---|---|
| Example | Stainless Steel Peel 24 Hour | Room Temp Shear | 70° C. Shear | 10 Second Peel Cold Rolled Steel | 1 Min. Peel Cold Rolled Steel | Percent Conversion |
| 116 | 32.6 | 1020 | 85 | 4.0 | 5.1 | >98 |
| 117 | 41.9 | 581 | 300 | 4.7 | 6.7 | >98 |
| 118 | 40.9 | 481 | 331 | 4.0 | 4.7 | >98 |
| 119 | 61.1 | 1927 | 426 | 4.6 | 10.3 | >98 |
| 120 | 50.7 | 5391 | 338 | 5.4 | 9.2 | >98 |
| 121 | 47.0 | 10K+ | 10K+ | 4.4 | 8.8 | >98 |
| 122 | 36.6 | 127 | 599 | 7.3 | 10.5 | >98 |
| 123 | 43.5 | 1314 | 10K+ | 9.3 | 12.4 | >98 |
| 124 | 56.8 | 810 | 17 | 7.9 | 12.5 | >98 |

TABLE 4-continued

PATENT EXAMPLES FOR TACKIFIED NPAs FOR OILY METAL SURFACES

| Example | Stainless Steel Peel 24 Hour | Room Temp Shear | 70° C. Shear | 10 Second Peel Cold Rolled Steel | 1 Min. Peel Cold Rolled Steel | Percent Conversion |
|---|---|---|---|---|---|---|
| C4 | 51.2 | O(DNS) | O(DNS) | 10K+ | nt | >97 |
| C5 | 37.6 | O(DNS) | O(DNS) | 10K+ | nt | >97 |
| C6 | 61.5 | O(DNS) | 0.7 | 10K+ | nt | >97 |

What is claimed is:

1. A pressure sensitive adhesive comprising
   (a) the reaction product of:
      (i) 25–98 parts by weight of an acrylic acid ester of a monohydric alcohol whose homopolymer has a Tg less than 0° C.;
      (ii) 2–75 parts by weight of a non-polar ethylenically unsaturated monomer selected from the group consisting of 3,3,5 trimethylcyclohexyl acrylate, cyclohexyl acrylate, isobornyl acrylate, and t-butyl acrylate whose homopolymer has a solubility parameter of no greater than 10.50 and a Tg greater than 15° C.; and
      (iii) 0–5 parts by weight of a polar ethylenically unsaturated monomer whose homopolymer has a solubility parameter of greater than 10.50 and a Tg greater than 15° C.; and
   (b) at least one tackifier that is miscible in said reaction product at room temperature.

2. The pressure sensitive adhesive of claim 1, wherein the relative amounts of said acrylic acid ester, said non-polar ethylenically unsaturated monomer, and said polar ethylenically unsaturated monomer are selected such that the 90° peel adhesion of said adhesive to a polypropylene surface is at least 2 lbs/0.5 in. after a 72 hour dwell at room temperature as measured according to Test Procedure B1.

3. The pressure sensitive adhesive of claim 1, wherein the relative amounts of said acrylic acid ester, said non-polar ethylenically unsaturated monomer, and said polar ethylenically unsaturated monomer are chosen such that the 90° peel adhesion of said adhesive to a polypropylene surface is at least 3 lbs/0.5 in. after a 72 hour dwell at room temperature as measured according to Test Procedure B1.

4. The pressure sensitive adhesive of claim 1, wherein the relative amounts of said acrylic acid ester, said non-polar ethylenically unsaturated monomer, and said polar ethylenically unsaturated monomer are chosen such that the 90° peel adhesion of said adhesive to a polypropylene surface is at least 5 lbs/0.5 in. after a 72 hour dwell at room temperature as measured according to Test Procedure B1.

5. The pressure sensitive adhesive of claim 1, wherein the relative amounts of said acrylic acid ester, said non-polar ethylenically unsaturated monomer, and said polar ethylenically unsaturated monomer are chosen such that the 90° peel adhesion of said adhesive to a surface provided with 1.5±0.25 mg/in$^2$ oil is greater than zero after a 10 second dwell at room temperature as measured according to Test Procedure B2.

6. The pressure sensitive adhesive of claim 1, wherein the relative amounts of said acrylic acid ester, said non-polar ethylenically unsaturated monomer, and said polar ethylenically unsaturated monomer are chosen such that the 90° peel adhesion of said adhesive to a surface provided with 1.5±0.25 mg/in$^2$ oil is at least 2 oz/0.5 in. after a 10 second dwell at room temperature as measured according to Test Procedure B2.

7. The pressure sensitive adhesive of claim 1, wherein the relative amounts of said acrylic acid ester, said non-polar ethylenically unsaturated monomer, and said polar ethylenically unsaturated monomer are chosen such that the 90° peel adhesion of said adhesive to a surface provided with 1.5±0.25 mg/in$^2$ oil is at least 4 oz/0.5 in. after a 10 second dwell at room temperature as measured according to Test Procedure B2.

8. The pressure sensitive adhesive of claim 1, wherein the relative amounts of said acrylic acid ester, said non-polar ethylenically unsaturated monomer, and said polar ethylenically unsaturated monomer are chosen such that the 90° peel adhesion of said adhesive to a surface provided with 1.5±0.25 mg/in$^2$ oil is at least 5 oz/0.5 in. after a 1 minute dwell at room temperature as measured according to Test Procedure B2.

9. The pressure sensitive adhesive of claim 1, wherein the relative amounts of said acrylic acid ester, said non-polar ethylenically unsaturated monomer, and said polar ethylenically unsaturated monomer are chosen such that the 90° peel adhesion of said adhesive to a surface provided with 1.5±0.25 mg/in$^2$ oil is at least 10 oz/0.5 in. after a 1 minute dwell at room temperature as measured according to Test Procedure B2.

10. The pressure sensitive adhesive of claim 1, wherein the relative amounts of said acrylic acid ester, said non-polar ethylenically unsaturated monomer, and said polar ethylenically unsaturated monomer are chosen such that the shear strength of said adhesive at both room temperature and at 70° C. is greater than 50 minutes as measured according to Test Procedures C1 and C2.

11. The pressure sensitive adhesive of claim 1, wherein the relative amounts of said acrylic acid ester, said non-polar ethylenically unsaturated monomer, and said polar ethylenically unsaturated monomer are chosen such that the shear strength of said adhesive at both room temperature and at 70° C. is greater than 1,000 minutes as measured according to Test Procedures C1 and C2.

12. The pressure sensitive adhesive of claim 1, wherein the relative amounts of said acrylic acid ester, said non-polar ethylenically unsaturated monomer, and said polar ethylenically unsaturated monomer are chosen such that the shear strength of said adhesive at both room temperature and at 70° C. is greater than 10,000 minutes as measured according to Test Procedures C1 and C2.

13. The pressure sensitive adhesive of claim 1, wherein the 1 radian/second tan delta maximum temperature of said reaction product is between −45° C. and 15° C., inclusive.

14. The pressure sensitive adhesive of claim 1, wherein the 1 radian/second tan delta maximum temperature of said reaction product is between −20° C. and 0° C., inclusive.

15. The pressure sensitive adhesive of claim 1, comprising 70–97 parts by weight of said acrylic acid ester.

16. The pressure sensitive adhesive of claim 1, wherein said adhesive comprises the reaction product of said acrylic acid ester, said non-polar ethylenically unsaturated monomer, and 0 parts by weight of said polar ethylenically unsaturated monomer.

17. The pressure sensitive adhesive of claim 1, comprising 3–30 parts by weight of said non-polar ethylenically unsaturated monomer.

18. The pressure sensitive adhesive of claim 1, comprising 0–3 parts by weight of said polar ethylenically unsaturated monomer.

19. The pressure sensitive adhesive of claim 1, comprising an acrylic acid ester selected from the group consisting of isooctyl acrylate, 2-ethyl hexyl acrylate, isononyl acrylate, isodecyl acrylate, decyl acrylate, lauryl acrylate, hexyl acrylate, butyl acrylate, octadecyl acrylate, and combinations thereof.

20. The pressure sensitive adhesive of claim 1, wherein said non-polar ethylenically unsaturated monomer is isobornyl acrylate.

21. The pressure sensitive adhesive of claim 1, comprising a polar ethylenically unsaturated monomer selected from the group consisting of acrylic acid, itaconic acid, N,N-dimethylacrylamide, N-vinyl-2-pyrrolidone, N-vinyl caprolactam, acrylonitrile, tetrahydrofurfuryl acrylate, glycidyl acrylate, 2-phenoxyethylacrylate, benzylacrylate, and combinations thereof.

22. The pressure sensitive adhesive of claim 1, comprising said tackifier in an amount ranging from 5–60 parts per 100 parts acrylate-containing polymer.

23. The pressure sensitive adhesive of claim 1, comprising said tackifier in an amount ranging from 15–30 parts per 100 parts acrylate-containing polymer.

24. The pressure sensitive adhesive of claim 1, comprising the reaction product of isooctyl acrylate, isobornyl acrylate, and acrylic acid.

25. The pressure sensitive adhesive of claim 1, comprising the reaction product of isooctyl acrylate and isobornyl acrylate.

26. A pressure sensitive adhesive comprising
  (a) the reaction product of:
    (i) 25–98 parts by weight of an acrylic acid ester of a monohydric alcohol whose homopolymer has a Tg less than 0° C.;
    (ii) 2–75 parts by weight of a non-polar ethylenically unsaturated monomer selected from the group consisting of 3,3,5 trimethylcyclohexyl acrylate, cyclohexyl acrylate, isobornyl acrylate, and t-butyl acrylate whose homopolymer has a solubility parameter of no greater than 10.50 and a Tg greater than 15° C.; and
    (iii) 0 parts by weight of a polar ethylenically unsaturated monomer whose homopolymer has a solubility parameter of greater than 10.50 and a Tg greater than 15° C.; and
  (b) at least one tackifier that is miscible in said reaction product at room temperature.

* * * * *